United States Patent
McConnelee et al.

(10) Patent No.: US 8,829,690 B2
(45) Date of Patent: Sep. 9, 2014

(54) SYSTEM OF CHIP PACKAGE BUILD-UP

(71) Applicant: General Electric Company, Schenectady, NY (US)

(72) Inventors: Paul Alan McConnelee, Albany, NY (US); Kevin Matthew Durocher, Waterford, NY (US); Scott Smith, Niskayuna, NY (US); Laura A. Principe, Charlton, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/138,333

(22) Filed: Dec. 23, 2013

(65) Prior Publication Data

US 2014/0110866 A1    Apr. 24, 2014

Related U.S. Application Data

(62) Division of application No. 12/843,606, filed on Jul. 26, 2010, now Pat. No. 8,623,699.

(51) Int. Cl.
*H01L 23/00* (2006.01)

(52) U.S. Cl.
USPC ........... 257/783; 257/782; 257/659; 257/776; 257/E21.499

(58) Field of Classification Search
USPC ......... 257/659–660, 782–783, 774, 776, 700, 257/759, 735–736, E21.499
See application file for complete search history.

(56) References Cited

U.S. PATENT DOCUMENTS

| | | | | |
|---|---|---|---|---|
| 5,527,741 A * | 6/1996 | Cole et al. | ...................... | 438/107 |
| 5,635,762 A * | 6/1997 | Gamand | ....................... | 257/728 |
| 5,757,072 A | 5/1998 | Gorowitz et al. | | |
| 6,255,137 B1 | 7/2001 | Gorczyca et al. | | |
| 6,933,813 B2 | 8/2005 | Burdick, Jr. et al. | | |
| 7,485,562 B2 * | 2/2009 | Chua et al. | ..................... | 438/613 |
| 8,319,318 B2 * | 11/2012 | Nalla et al. | .................... | 257/660 |
| 2011/0254124 A1 * | 10/2011 | Nalla et al. | .................... | 257/531 |
| 2012/0171816 A1 | 7/2012 | Kapusta et al. | | |

* cited by examiner

*Primary Examiner* — Thanh Nguyen
(74) *Attorney, Agent, or Firm* — Ziolkowski Patent Solutions Group, SC; Jean K. Testa

(57) ABSTRACT

A system and method for chip package fabrication is disclosed. The chip package includes a base re-distribution layer having an opening formed therein, an adhesive layer having a window formed therein free of adhesive material, and a die affixed to the base re-distribution layer by way of the adhesive layer, the die being aligned with the window such that only a perimeter of the die contacts the adhesive layer. A shield element is positioned between the base re-distribution layer and adhesive layer that is generally aligned with the opening formed in the base re-distribution layer and the window of the adhesive layer such that only a perimeter of the shield element is attached to the adhesive layer. The shield element is separated from the die by an air gap and is configured to be selectively removable from the adhesive layer so as to expose the front surface of the die.

14 Claims, 5 Drawing Sheets

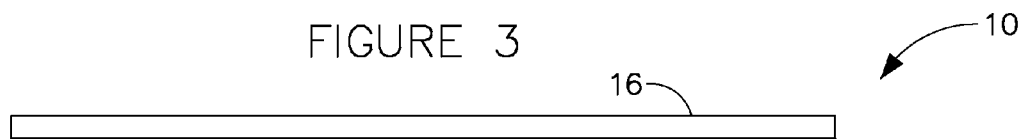
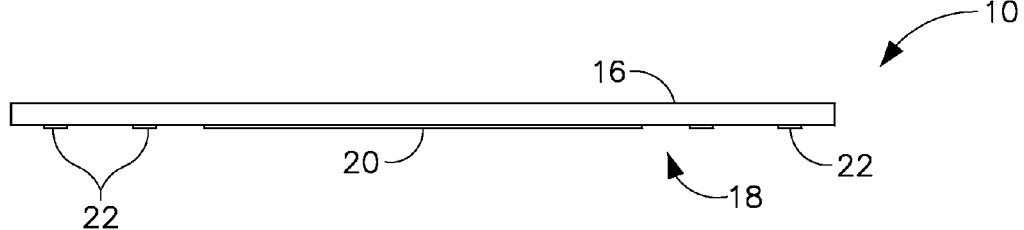
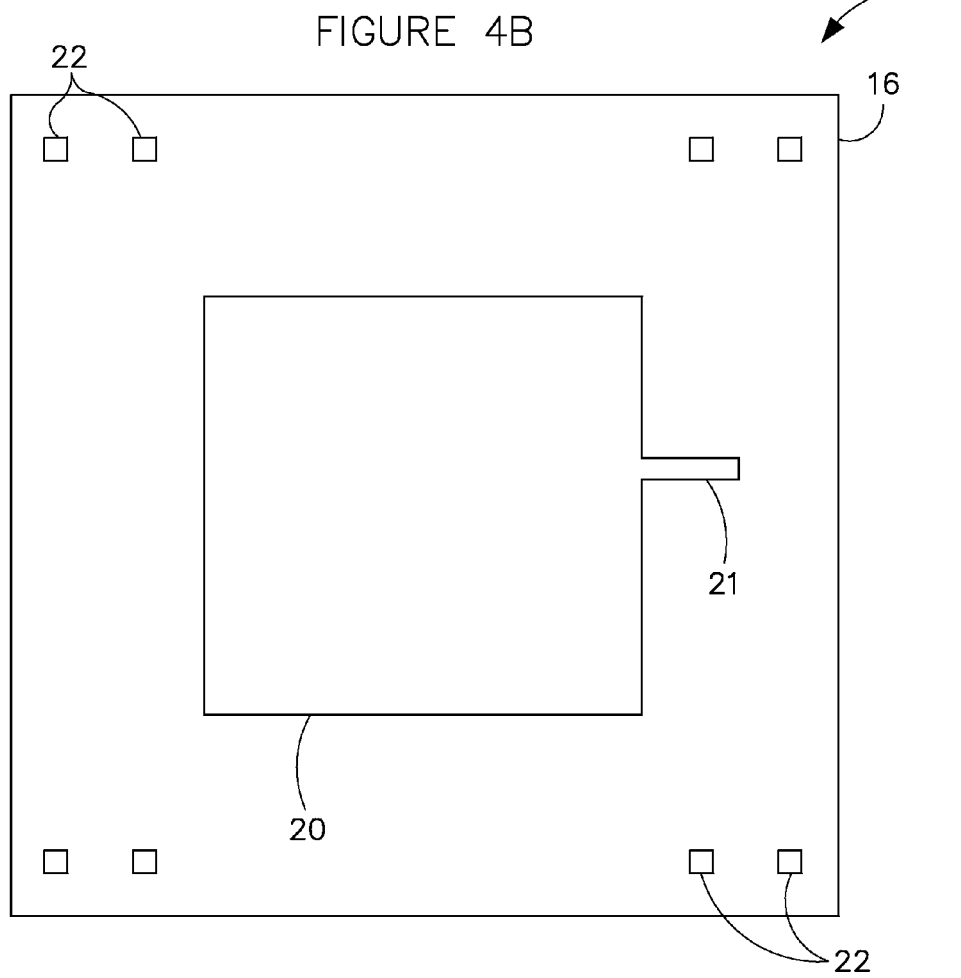

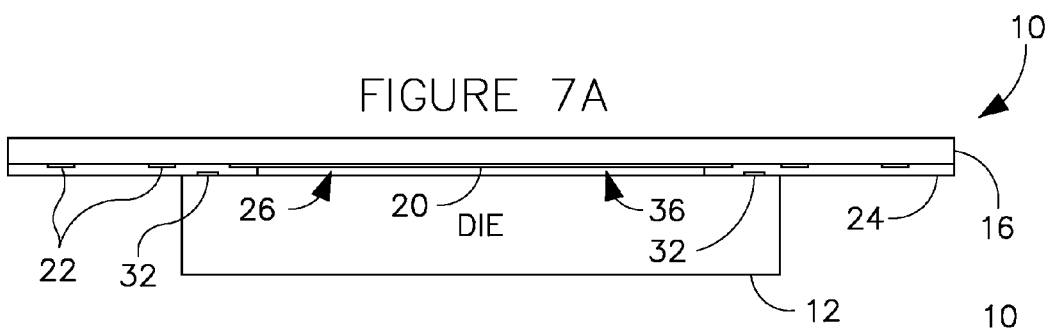
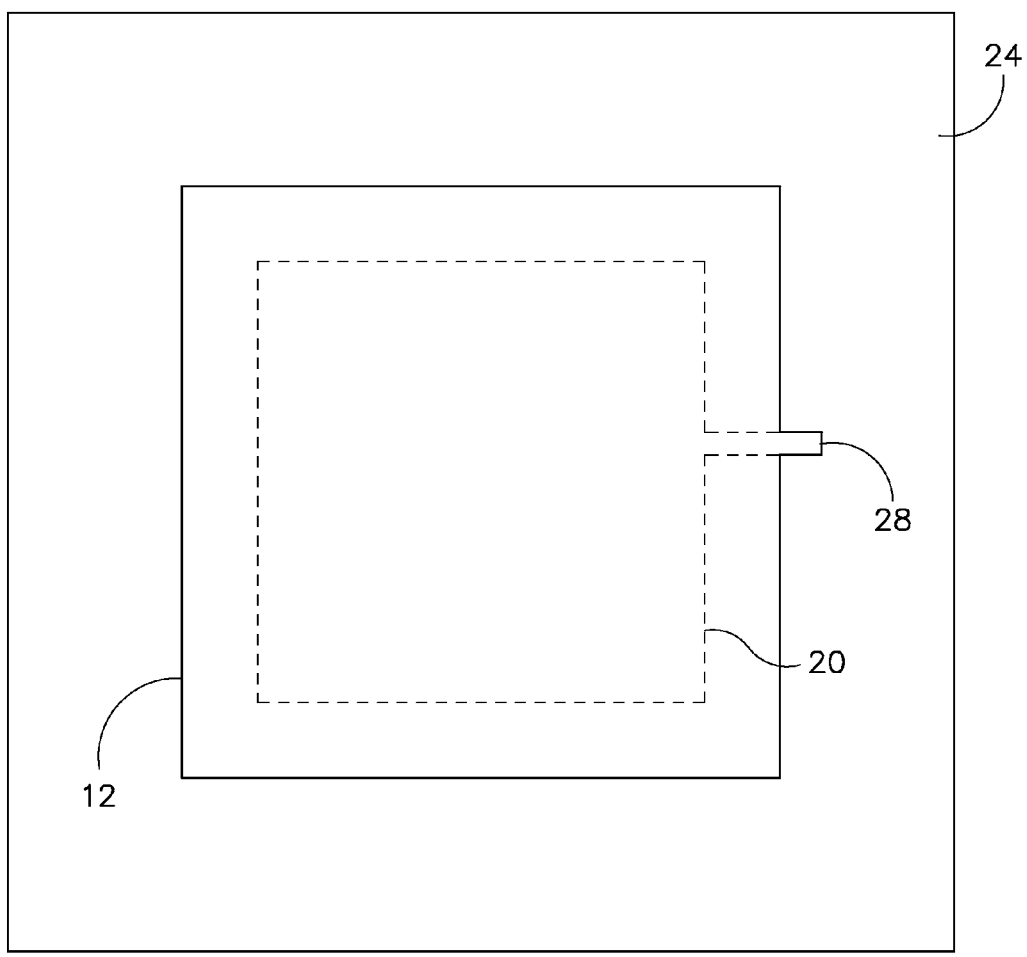
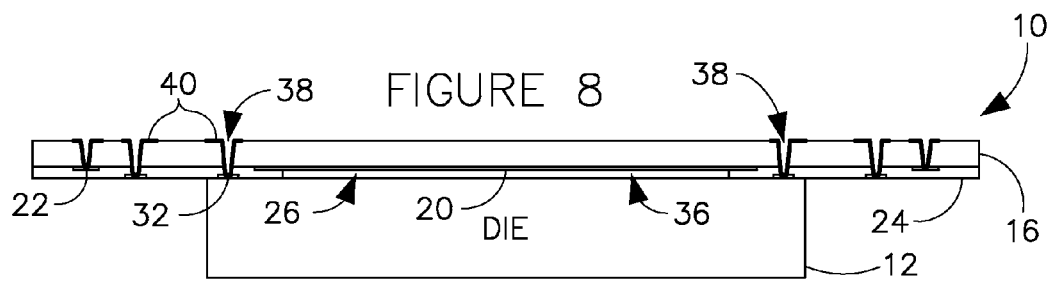

SYSTEM OF CHIP PACKAGE BUILD-UP

CROSS-REFERENCE TO RELATED APPLICATION

The present application is a divisional of, and claims priority to, U.S. patent application Ser. No. 12/843,606, filed Jul. 26, 2010, the disclosure of which is incorporated herein by reference.

BACKGROUND OF THE INVENTION

Embodiments of the invention relate generally to integrated circuit chip packages and, more particularly, to chip package build-up. Chip packages are manufactured using a technique that protects the die from contamination during a build-up process of the chip package.

Integrated circuit (IC) chip packages are typically fabricated to include one or more dies that are attached to a laminate re-distribution layer. The laminate re-distribution layer is comprised of a dielectric laminate material, such as Kapton®, and is affixed to the die by way of an adhesive layer. The die(s) are electrically connected to an input/output system by way of metal interconnects routed through a plurality of additional laminate re-distribution layers that are adhered to the base re-distribution layer.

A standard chip package manufacturing or build-up process typically begins with providing of the base laminate re-distribution layer and application of an adhesive on one surface thereof. The one or more dies are then secured relative to the base laminate re-distribution layer by applying a front or active face of the die(s) onto the adhesive layer such that a bond is formed between the active face of the die(s) and the adhesive layer across the full face of the die(s). Metal interconnects are then formed and routed through the base laminate re-distribution layer and through any additional laminate re-distribution layers that are subsequently added during build-up of the chip package.

Deposition of the die(s) onto the base re-distribution layer in this manner, however, has inherent limitations in regards to the production process and the structure and functionality of the resulting chip package that is produced. That is, in some applications it is desirable that the active face of the die(s) be protected from possible contamination during the build-up process of the chip package. For example, for application of the chip package in an imaging device such as an ultra camera or similar sensing device, it is desired that the imager area (i.e., the die) be protected from contamination during the build-up process. As the imager area/die in such an application is to be left exposed upon completion of the build-up of the chip package, it is undesirable for a bond to be formed between the active face of the die and the adhesive layer across the full face of the die during the build-up process. Such a build-up would require subsequent removal of the adhesive from the imaging area and could introduce contaminates to the imaging area, thereby negatively affecting the performance of the ultra camera/sensing device.

Accordingly there is a need for a method for chip package fabrication that protects the die from contamination during the build-up process. There is a further need for the fabrication method to be readily incorporated into an assembly process, be compatible with laser drilling, be scalable, and provide for a low cost assembly.

BRIEF DESCRIPTION OF THE INVENTION

Embodiments of the invention overcome the aforementioned drawbacks by providing a method of chip fabrication in which the chip package is manufactured using a removable shield element that is placed over the die and separated therefrom by an air pocket. The shield element protects the die from contamination during the build-up process and can be subsequently removed therefrom to expose a clean front surface of the die.

In accordance with one aspect of the invention, a chip package includes a base re-distribution layer having an opening formed therein in a center area of the base re-distribution layer, an adhesive layer applied to one side of the base re-distribution layer having a window formed therein free of adhesive material, and a die having a front surface affixed to the base re-distribution layer by way of the adhesive layer, wherein the die is aligned with the window formed in the adhesive layer such that only a perimeter of the front surface of the die is in contact with the adhesive layer. The chip package also includes a plurality of vias and a plurality of metal interconnects formed in the base re-distribution layer to electrically connect the base re-distribution layer to the die and a shield element positioned between the base re-distribution layer and the adhesive layer and generally aligned with the opening formed in the base re-distribution layer and the window of the adhesive layer such that only a perimeter of the shield element is attached to the adhesive layer, with the shield element being separated from the die by an air gap. The shield element is configured to be selectively removable from the adhesive layer so as to expose the front surface of the die.

In accordance with another aspect of the invention, a method of forming a chip package includes providing an initial polymer laminate layer, depositing a metallic shield element on one surface of the initial polymer laminate layer so as to cover a portion thereof, and applying an adhesive layer to the initial polymer laminate layer and over the metallic shield element, the adhesive layer having a portion removed therefrom to form a window in the adhesive layer that corresponds substantially to a surface area of the metallic shield element and aligned therewith. The method also includes adhering a die to the initial polymer laminate layer by way of the adhesive layer, with the die being positioned over the window such a perimeter of the die is in contact with the adhesive layer and an air pocket is formed between a center portion of the die and the shield element. The method further includes patterning the initial polymer laminate layer to include a plurality of vias and a plurality of metal interconnects so as to electrically connect the initial polymer laminate layer to the die, defining a portion of the initial polymer laminate layer corresponding to the window in the adhesive layer, and removing the portion of the initial polymer laminate layer and the metallic shield element from the adhesive layer so as to expose a front surface of the die.

In accordance with yet another aspect of the invention, a method for manufacturing a chip module includes providing a base re-distribution layer, depositing a shield element on one surface of the base re-distribution layer so as to cover a portion thereof, applying an adhesive layer to the base re-distribution layer and over the shield element, ablating a portion of the adhesive layer in an area adjacent to the shield element so as to expose at least a majority of the shield element, and applying a front surface of a die to the adhesive layer such that the die is aligned with the shield element, wherein a perimeter of the die is in contact with the adhesive layer and a center portion of the die is separated from the shield element by an air gap formed therebetween. The method also includes maintaining the shield element in place during a subsequent patterning of the base re-distribution layer that forms a plurality of vias and a plurality of metal interconnects to electrically connect the base re-distribution layer to the die, ablating a portion of the base re-distribution layer adjacent to the shield element, and removing the shield element and the portion of the base distribution layer so as to expose the front surface of the die.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 2-11 are cross-sectional side views and top views of an embedded chip package during various stages of a manufacturing/build-up process according to an embodiment of the invention.

DETAILED DESCRIPTION OF THE PREFERRED EMBODIMENT

Embodiments of the present invention provide for a method of forming a chip package. The chip package is manufactured using a shield element or protective layer to protect the surface of a die during build-up and patterning of laminate re-distribution layers of the chip package.

Figure 1:
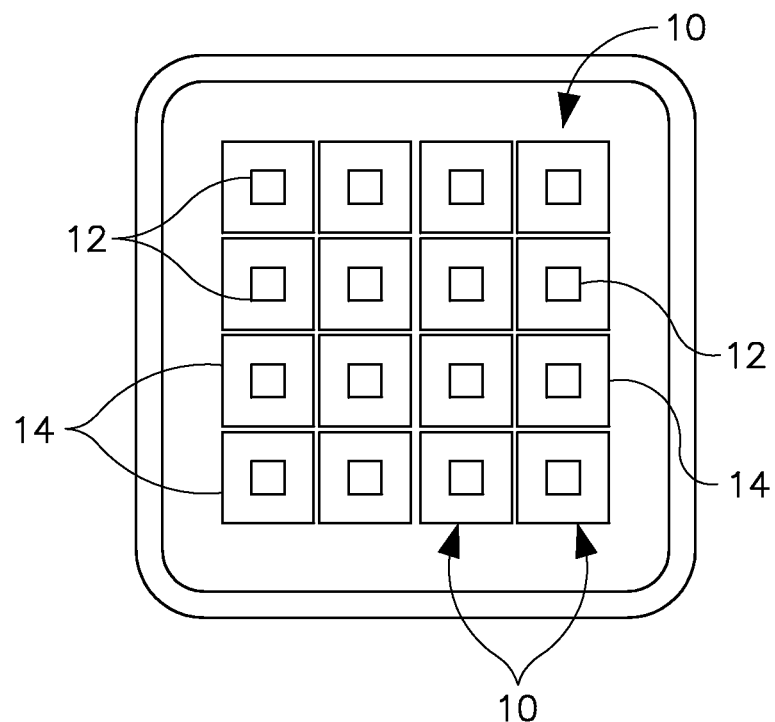
FIG. 1 is a top view of a plurality of embedded chip packages according to an embodiment of the invention.

Referring to FIG. 1, a plurality of manufactured chip packages 10 or chip modules are shown. Each chip package 10 includes a die 12 connected with a plurality of re-distribution layers 14 (i.e., laminate layers). Each die 12 is formed from a monosilicon crystal ingot or polysilicon crystal ingot and prepared such that an integrated circuit (IC) layout is formed on its surface. According to one embodiment of the invention, die 12 is configured for use in an imaging device such as an ultra camera, cellular phone camera, or similar sensing device. Die 12 is thus constructed as a "camera die" that forms an imaging area for image sensing. Regarding re-distribution layers 14 of chip package 10, each of the plurality of re-distribution layers 14 is in the form of a pre-formed laminate sheet or film that can be placed relative to the die 12. The re-distribution layers 14 can be formed of Kapton®, Ultem®, polytetrafluoroethylene (PTFE), or another polymer film, such as a liquid crystal polymer (LCP) or a polyimide material. As shown in FIG. 1, each chip package 10 is formed by dicing through re-distribution layers 14 in an area between adjacent chip packages 10.

Figure 2:
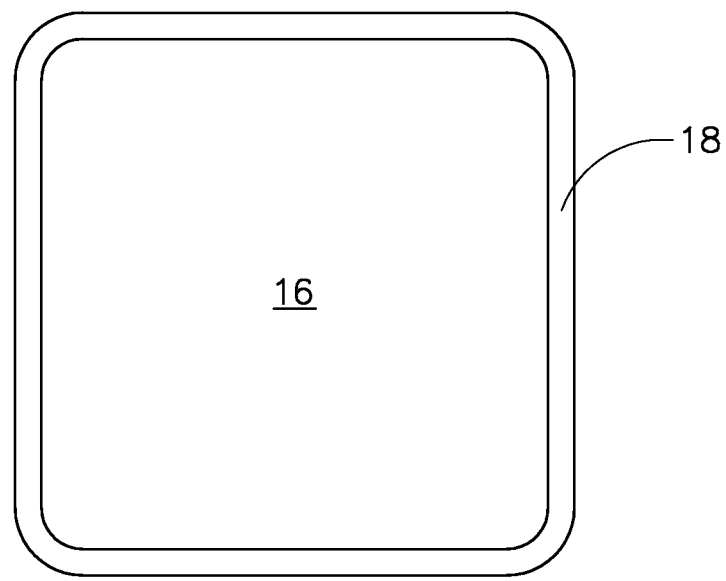

As shown in FIGS. 2-9, steps in a technique for manufacturing a plurality of chip packages 10 (i.e., a chip build-up) are set forth, according to an embodiment of the invention, with side cross-sectional views and top views of chip package(s) 10 being shown at various stages of the build-up process. Referring to FIG. 2, a complete frame of an initial or base re-distribution layer 16 is provided and mounted on a frame 18 to allow for additional manufacturing steps to be performed thereon. As set forth above, the initial re-distribution layer 16 is in the form of a flexible polymer laminate layer, such as Kapton®, Ultem®, polytetrafluoroethylene (PTFE), or another polymer/polyimide film, and is of a size that allows for the production of a plurality of chip packages 10 therefrom.

A portion of the complete frame of the initial re-distribution layer 16, and of additional layers and components added thereto, is shown in FIGS. 3-9, such that build-up of a single chip package 10 is illustrated. As shown in FIG. 3, initial re-distribution layer 16 is provided. According to the build-up process, a metal layer 18 is then deposited on one side of initial re-distribution layer 16, as shown in FIGS. 4A and 4B, with the metal layer 18 being formed of a material that will provide a suitable bond with an adhesive that will subsequently be applied (e.g., Ti/Cu/Ti, chrome, etc.). The metal layer 18 may be sputtered on initial re-distribution layer 16 or added in any other suitable manner, such as electroplating. The metal layer 18 is patterned such that a protective shield element 20 is formed having an area that, according to one embodiment, substantially matches an area of die 12 (FIG. 1) to be subsequently added to chip package 10, as will be explained in detail below. Alternatively, it is recognized that protective shield element 20 could be formed to have an area much smaller than an area of a die 12 (FIG. 1). As further shown in FIGS. 4A and 4B, metal layer 18 is further patterned to form a vent base 21 that extends out from shield element 20 past an area of die 12 (FIG. 1) to be added. According to one embodiment, metal layer 18 may be further patterned so as to form a plurality of base metal interconnects 22 on initial re-distribution layer 16.

Figure 5:
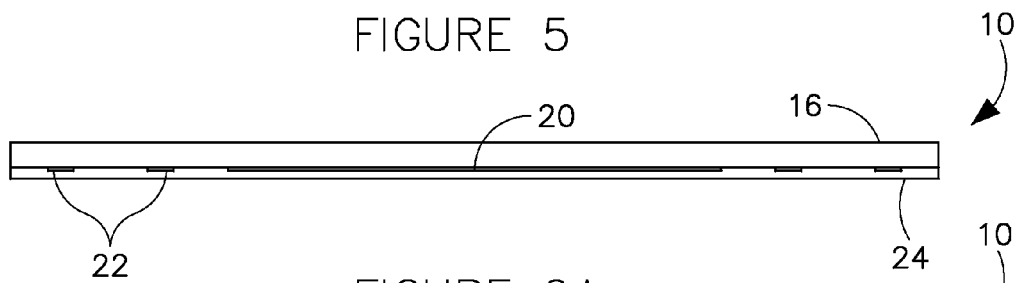
Figure 6A:
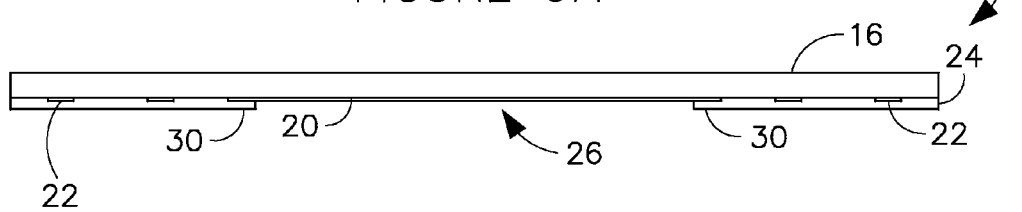
Figure 6B:
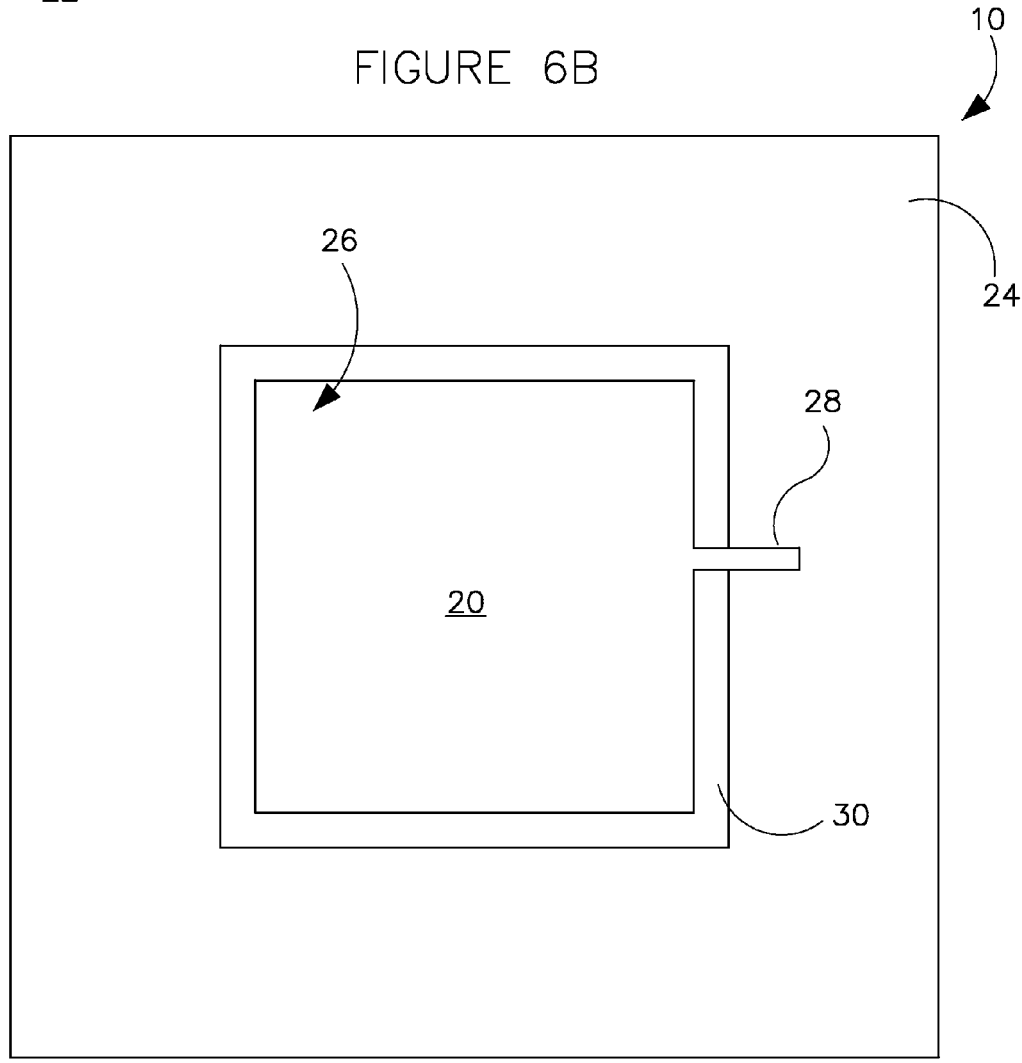

Referring now to FIG. 5, in a next step of the build-up technique of chip package 10, an adhesive layer 24 is applied to initial re-distribution layer 16 and over metal layer 18. The adhesive layer 24 may be applied to initial re-distribution layer 16 via a spin coating application of an ablatable epoxy or may alternatively be in the form of an adhesive film that is applied onto initial re-distribution layer 16. The adhesive layer 24 is then partially cured or baked. Upon partial curing, the adhesive layer 24 is ablated, such as by way of an ultraviolet (UV) laser, so as to form a window 26 as shown in FIGS. 6A and 6B. Specifically, the adhesive layer 24 that was applied over shield element 20 is laser ablated so as to form a window 26 that exposes the shield element 20. Additionally, the adhesive layer 24 that was applied over vent base 21 is laser ablated so as to also form a small vent 28 to the outside of the die area (i.e., extending out from window 26). During laser ablation of adhesive layer 24 to form window 26 and vent 28, it is recognized that shield element 20 and vent base 21 act as a "back stop" that prevents the laser from passing therethrough to the initial re-distribution layer 16.

In an alternative embodiment of the manufacturing technique for build-up of chip package 10, it is recognized that a pre-cut laminate film could be applied to initial re-distribution layer 16. That is, rather than applying a continuous adhesive layer 24 via spin coating and subsequently laser ablating the adhesive layer 24 to form window 26, as shown in FIGS. 5 and 6A/6B, an adhesive film with a window pre-formed therein could be applied to initial re-distribution layer 16, such that no laser ablating of the adhesive layer is required.

Upon completion of the laser ablation of adhesive layer 24, a portion 30 of the adhesive layer 24 surrounding the ablated area (i.e., window 26) is exposed to UV light. This exposure to UV light partially cures portion 30 such that the adhesive layer 24 is prevented from encroaching into the ablated window 26.

Referring now to FIGS. 7A and 7B, the build-up of chip package 10 continues with the aligning and placing of die 12 (i.e., IC) onto initial re-distribution layer 16 by way of adhesive layer 24. The die 12 is centered over window 26 and is pressed onto adhesive layer 24, at which time the adhesive layer 24 is fully cured so as to secure the die 12 to initial re-distribution layer 16, such as by way of a vacuum lamination and pressure bake curing process. As shown in FIGS. 7A and 7B, the die 12 is sized such that it extends out past shield element 20. Beneficially, die pads 32 formed around a periphery of the die 12 thus are positioned outside the area of die 12 covered by shield element 20, allowing for subsequent electrical connection to the die pads 32. Additionally, as die 12 extends out past shield element 20, the die 12 thus rests on adhesive layer 24 and forms an air pocket 36 between the die 12 and shield element 20. The air gap 36, in conjunction with shield element 20, functions to keep a top surface of die 12 clean of contamination. As set forth above in FIG. 5, a vent port 28 is ablated into adhesive layer 24, with the vent port 28 extending outward from air pocket 36 to a region of chip package 10 outside of that covered by die 12. As the vent port 28 provides fluid communication between air gap 36 and an ambient environment outside an area covered by die 12, pressure in the air gap 36 can thus be controlled, such as pressure that might otherwise increase in air pocket 36 during temperature cycling associated with the build-up process of chip package 10.

Referring now to FIG. 8, upon securing of the die 12 to initial re-distribution layer 16, the initial re-distribution layer 16 is patterned to have a plurality of vias 38 which are drilled through the polymer material forming the re-distribution layer 16. According to an exemplary embodiment, the vias 38 are formed by way of a laser ablation or laser drilling process and are formed at positions corresponding to base metal interconnects 22 and to die pads 32, so as to expose the base metal interconnects 22 and die pads 32. Alternatively, it is also recognized that vias 38 may be formed by way of other methods including: plasma etching, photo-definition, or mechanical drilling processes.

As further shown in FIG. 8, the patterning of the initial re-distribution layer 16 includes the application of a metal layer/material (e.g., a seed metal and/or copper) applied onto the re-distribution layer 16 by way of, for example, a sputtering or electroplating process and the subsequent patterning/etching of the deposited metal layer/material to form metal interconnects 40. According to one embodiment of the invention, the metal layer/material is patterned and etched such that metal interconnects 40 are formed that extend from a top surface of initial re-distribution layer 16 and down through vias 38. Metal interconnects 40 thus form an electrical connection with base metal interconnects 22 and die pads 32.

Figure 9:
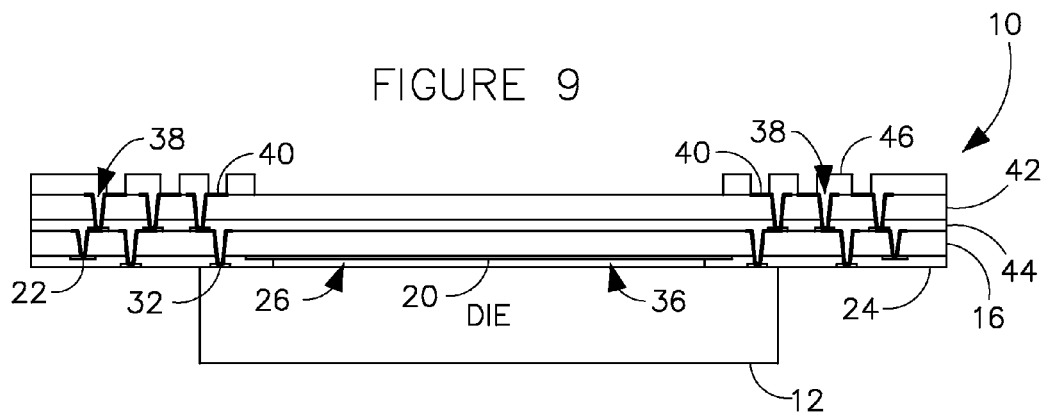

Referring now to FIG. 9, in a next step of the manufacturing technique, one or more additional re-distribution layers 42 are laminated onto the initial re-distribution layer 16 on a side of chip package 10 opposite from which the die 12 was applied. The additional re-distribution layer(s) 42 are applied to the initial re-distribution layer 16 through a series of lamination and patterning steps. An adhesive layer 44 is applied between the initial re-distribution layer 16 and an additional re-distribution layer 42 applied thereto. A plurality of vias 38 is formed in the additional re-distribution layer(s) 42, and metal interconnects 40 are formed/patterned to extend down through vias 38 and through the additional re-distribution layer(s) 42, so as to electrically connect each additional re-distribution layer 42. While only one additional re-distribution layer 42 is shown applied to initial re-distribution layer 16 to form chip package 10, it is recognized that more re-distribution layers could be applied based on a desired configuration. As shown in FIG. 9, in further steps of the build-up process, a solder mask 46 can be applied to an outermost additional re-distribution layer 42 and subsequently patterned so as to provide protection thereto. It is also envisioned that additional components, such as passive devices (not shown), may also be added to chip package 10, with the passive attach being performed while protective shield 20 is in place, such that die 12 is protected during such a passive attach.

Figure 10:
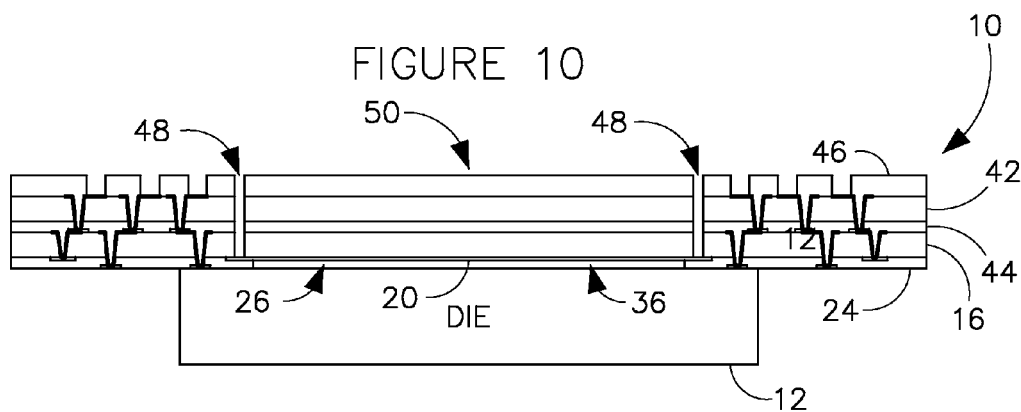

In a next step of the chip manufacturing technique, and as shown in FIG. 10, the initial re-distribution layer 16, additional re-distribution layer(s) 42, and adhesive layer(s) 44 are laser ablated along a path 48 corresponding to a perimeter of protective shield 20, so as to define or separate out a portion 50 of the initial re-distribution layer 16, additional re-distribution layer(s) 42, and adhesive layer(s) 44. The laser ablation is performed through the initial re-distribution layer 16, additional re-distribution layer(s) 42, and adhesive layer(s) 44 down to protective shield 20, where the laser is stopped by the protective shield 20. Upon completion of the ablation, the portion 50 of the initial re-distribution layer 16, additional re-distribution layer(s) 42, and adhesive layer(s) 44 positioned above protective shield 20, about which the laser ablation was performed, is removed from chip package 10 along with protective shield 20. That is, protective shield 20 sticks to initial re-distribution layer 16 and tears readily from adhesive layer 24, such that it can be removed from chip package 10 along with portion 50 in a single removal step. According to embodiments of the invention, portion 50 and protective shield 20 can be removed via one of several techniques, such as vacuum pickup or water scrubbing.

Figure 11:
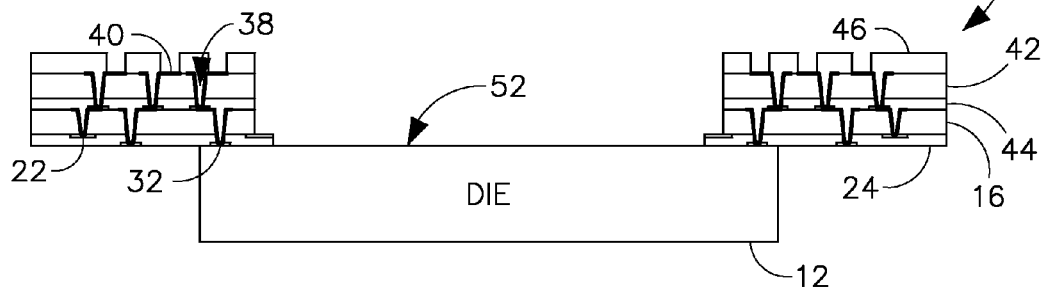

As shown in FIG. 11, removal of portion 50 and protective shield 20 exposes the front surface 52 of die 12 (i.e., die front) in the completed chip package 10. Beneficially, and based on the presence of protective shield 20 above die front 52 (spaced therefrom by air pocket 36) during a duration of the build-up process, the die front 52 should be clean of contamination.

Beneficially, construction of chip package 10 according to the technique illustrated in FIGS. 2-9, provides for a chip package build-up that protects die 12 from contamination during the build-up process. Additionally, the build-up technique provides for manufacturing of a chip package 10 having a decreased thickness, limited only be minimum thickness requirements of die 12 and re-distribution layer(s) 16, 42. Such a reduced thickness chip package 10 may be configured for use in an imaging device such as an ultra camera, cellular phone camera, or similar sensing device, with the build-up process allowing for mounting of a camera lens (not shown) directly to chip package 10. However, it is also recognized that the reduced thickness chip package 10 could be configured for use in other device types, such as microwave devices, or other devices that would benefit from the manufacturing technique set forth above.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

Therefore, according to one embodiment of the invention, a chip package includes a base re-distribution layer having an opening formed therein in a center area of the base re-distribution layer, an adhesive layer applied to one side of the base re-distribution layer having a window formed therein free of adhesive material, and a die having a front surface affixed to the base re-distribution layer by way of the adhesive layer, wherein the die is aligned with the window formed in the adhesive layer such that only a perimeter of the front surface of the die is in contact with the adhesive layer. The chip package also includes a plurality of vias and a plurality of metal interconnects formed in the base re-distribution layer to electrically connect the base re-distribution layer to the die and a shield element positioned between the base re-distribution layer and the adhesive layer and generally aligned with the opening formed in the base re-distribution layer and the window of the adhesive layer such that only a perimeter of the shield element is attached to the adhesive layer, with the shield element being separated from the die by an air gap. The shield element is configured to be selectively removable from the adhesive layer so as to expose the front surface of the die.

According to another embodiment of the invention, a method of forming a chip package includes providing an initial polymer laminate layer, depositing a metallic shield element on one surface of the initial polymer laminate layer so as to cover a portion thereof, and applying an adhesive layer to the initial polymer laminate layer and over the metallic shield element, the adhesive layer having a portion removed therefrom to form a window in the adhesive layer that corresponds substantially to a surface area of the metallic shield element and aligned therewith. The method also includes adhering a die to the initial polymer laminate layer by way of the adhesive layer, with the die being positioned over the window such a perimeter of the die is in contact with the adhesive layer and an air pocket is formed between a center portion of the die and the shield element. The method further includes patterning the initial polymer laminate layer to include a plurality of vias and a plurality of metal interconnects so as to electrically connect the initial polymer laminate layer to the die, defining a portion of the initial polymer laminate layer corresponding to the window in the adhesive layer, and removing the portion of the initial polymer laminate layer and the metallic shield element from the adhesive layer so as to expose a front surface of the die.

According to yet another embodiment of the invention, a method for manufacturing a chip module includes providing a base re-distribution layer, depositing a shield element on one surface of the base re-distribution layer so as to cover a portion thereof, applying an adhesive layer to the base re-distribution layer and over the shield element, ablating a portion of the adhesive layer in an area adjacent to the shield element so as to expose at least a majority of the shield element, and applying a front surface of a die to the adhesive layer such that the die is aligned with the shield element, wherein a perimeter of the die is in contact with the adhesive layer and a center portion of the die is separated from the shield element by an air gap formed therebetween. The method also includes maintaining the shield element in place during a subsequent patterning of the base re-distribution layer that forms a plurality of vias and a plurality of metal interconnects to electrically connect the base re-distribution layer to the die, ablating a portion of the base re-distribution layer adjacent to the shield element, and removing the shield element and the portion of the base distribution layer so as to expose the front surface of the die.

What is claimed as new and desired to be protected by Letters Patent of the United States is:

1. A chip package comprising:
    a base re-distribution layer having an opening formed therein in a center area of the base re-distribution layer;
    an adhesive layer applied to one side of the base re-distribution layer, the adhesive layer having a window formed therein free of adhesive material;
    a die having a front surface affixed to the base re-distribution layer by way of the adhesive layer, wherein the die is aligned with the window formed in the adhesive layer such that only a perimeter of the front surface of the die is in contact with the adhesive layer;
    a plurality of vias and a plurality of metal interconnects formed in the base re-distribution layer to electrically connect the base re-distribution layer to the die; and
    a shield element positioned between the base re-distribution layer and the adhesive layer and generally aligned with the opening formed in the base re-distribution layer and the window of the adhesive layer such that only a perimeter of the shield element is attached to the adhesive layer, the shield element being separated from the die by an air gap;
    wherein the shield element is configured to be selectively removable from the adhesive layer so as to expose the front surface of the die.

2. The chip package of claim 1 further comprising a vent port formed in the adhesive layer, the vent port extending out from the air gap and past the perimeter of the die.

3. The chip package of claim 2 wherein the vent port is configured to place the air gap in fluid communication with an ambient environment.

4. The chip package of claim 1 further comprising:
    at least one additional re-distribution layer adhered to the base re-distribution layer on a side opposite from the die; and
    a plurality of vias and a plurality of metal interconnects formed in each of the additional re-distribution layers.

5. The chip package of claim 1 wherein the shield element comprises a patterned metallic shield.

6. The chip package of claim 1 wherein the die comprises a camera die configured to form an image sensing area.

7. A chip package comprising a die packaged within and electrically coupled to a package structure, wherein the chip package is formed by:
    providing a base re-distribution layer;
    depositing a shield element on one surface of the base re-distribution layer so as to cover a portion thereof;
    applying an adhesive layer to the base re-distribution layer and over the shield element, the adhesive layer having a portion removed therefrom to form a window in the adhesive layer that corresponds substantially to a surface area of the shield element and aligned therewith;
    adhering a die to the base re-distribution layer by way of the adhesive layer, the die being positioned over the window such a perimeter of the die is in contact with the adhesive layer and an air pocket is formed between a center portion of the die and the shield element;
    patterning the base re-distribution layer to include a plurality of vias and a plurality of metal interconnects, so as to electrically connect the base re-distribution layer to the die;
    defining a portion of the base re-distribution layer corresponding to the window in the adhesive layer; and
    removing the portion of the base re-distribution layer and the shield element from the adhesive layer so as to expose a front surface of the die.

8. The chip package of claim 7 wherein the chip package is further formed by laser ablating through the adhesive layer to form the window therein, the shield element acting as a back stop during the laser ablation.

9. The chip package of claim 7 wherein the chip package is further formed by laser ablating a vent port in the adhesive layer, the vent port extending out from the window formed in the adhesive layer and past the perimeter of the die to be placed on the adhesive layer.

10. The chip package of claim 7 wherein the chip package is further formed by partially curing the adhesive layer along a perimeter of the window so as to prevent adhesive material from encroaching into the window.

11. The chip package of claim 7 wherein defining the portion of the base re-distribution layer comprises laser ablating down through the base re-distribution layer to the shield element.

12. The chip package of claim 7 wherein removing the portion of the base re-distribution layer and the shield element comprises performing one of a vacuum pickup and a water scrubbing.

13. The chip package of claim 7 wherein the chip package is further formed by:
  adhering at least one additional dielectric layer to the base re-distribution layer; and
  patterning each of the at least one additional dielectric layers to include a plurality of vias and a plurality of metal interconnects.

14. A chip package comprising a die packaged within and electrically coupled to a package structure, wherein the chip package is formed by:
  providing a base re-distribution layer;
  depositing a shield element on one surface of the base re-distribution layer so as to cover a portion thereof;
  applying an adhesive layer to the base re-distribution layer and over the shield element;
  ablating a portion of the adhesive layer in an area adjacent to the shield element so as to expose at least a majority of the shield element;
  applying a front surface of a die to the adhesive layer such that the die is aligned with the shield element, wherein a perimeter of the die is in contact with the adhesive layer and a center portion of the die is separated from the shield element by an air gap formed therebetween;
  maintaining the shield element in place during a subsequent patterning of the base re-distribution layer, the patterning forming a plurality of vias and a plurality of metal interconnects to electrically connect the base re-distribution layer to the die;
  ablating a portion of the base re-distribution layer adjacent to the shield element; and
  removing the shield element and the portion of the base distribution layer so as to expose the front surface of the die.

* * * * *